(12) United States Patent
Li et al.

(10) Patent No.: US 6,476,477 B2
(45) Date of Patent: Nov. 5, 2002

(54) ELECTRONIC ASSEMBLY PROVIDING SHUNTING OF ELECTRICAL CURRENT

(75) Inventors: Yuan-Liang Li, Chandler; David G. Figueroa, Mesa; Priyavadan R. Patel, Chandler, all of AZ (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 09/729,813

(22) Filed: Dec. 4, 2000

(65) Prior Publication Data

US 2002/0066951 A1 Jun. 6, 2002

(51) Int. Cl.$^7$ .............................................. H01L 23/52
(52) U.S. Cl. ....................... 257/691; 257/700; 257/758; 257/678
(58) Field of Search ................................ 257/691, 698, 257/522, 678, 700, 734, 924, 778, 701, 797, 699, 693, 758

(56) References Cited

U.S. PATENT DOCUMENTS

| 4,782,340 A | * | 11/1988 | Czubatyj et al. | ............. 345/92 |
|---|---|---|---|---|
| 5,672,911 A | * | 9/1997 | Patil et al. | ................... 257/691 |
| 5,864,470 A | * | 1/1999 | Shim et al. | ................. 361/777 |
| 6,064,113 A | * | 5/2000 | Kirkman | ..................... 257/691 |
| 6,075,285 A | * | 6/2000 | Taylor et al. | ............... 257/691 |
| 6,137,161 A | * | 10/2000 | Gilliland et al. | ............ 257/678 |
| 6,198,635 B1 | * | 3/2001 | Shenoy et al. | .............. 361/760 |

FOREIGN PATENT DOCUMENTS

JP            57202776 A    * 12/1982

* cited by examiner

*Primary Examiner*—Eddie Lee
*Assistant Examiner*—Chris C. Chu
(74) *Attorney, Agent, or Firm*—Blakely, Sokoloff, Taylor & Zafman LLP

(57) ABSTRACT

The invention provides an electronic assembly including a semiconductor chip and a semiconductor package substrate having power and ground shunts. The power and ground shunts of the semiconductor chip include contact pads on a surface thereof that are electrically connected to one another to protect electrical signal contacts on the contact pads from high, low-frequency current. The power shunt in the semiconductor package substrate connects one power plane to another and the ground shunts in the semiconductor package substrate connects one ground plane to another. The power and ground shunts in the semiconductor package substrate dictate terminal pins thereon from high, low-frequency current.

25 Claims, 4 Drawing Sheets

Figure 1:
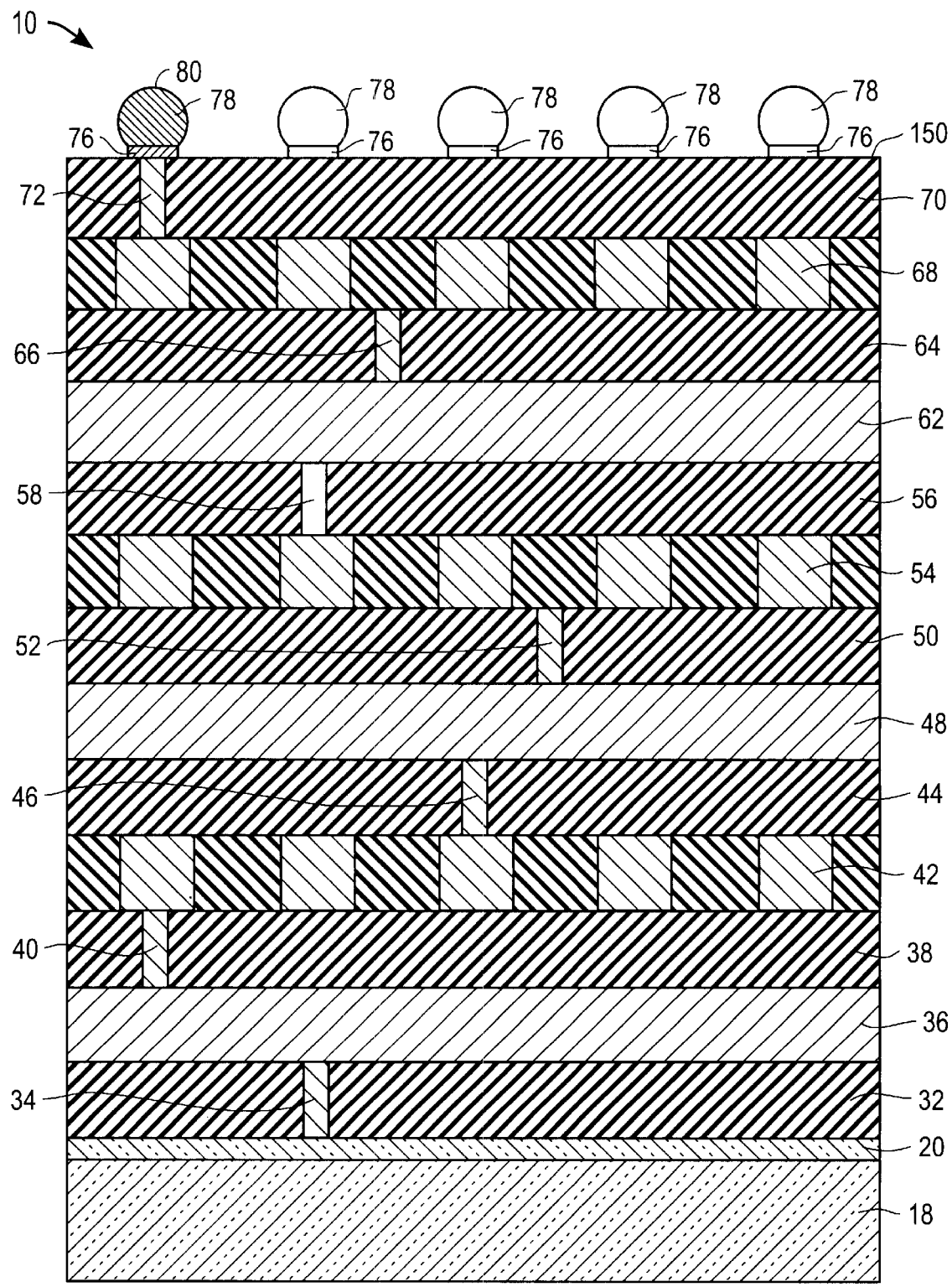
Figure 2:
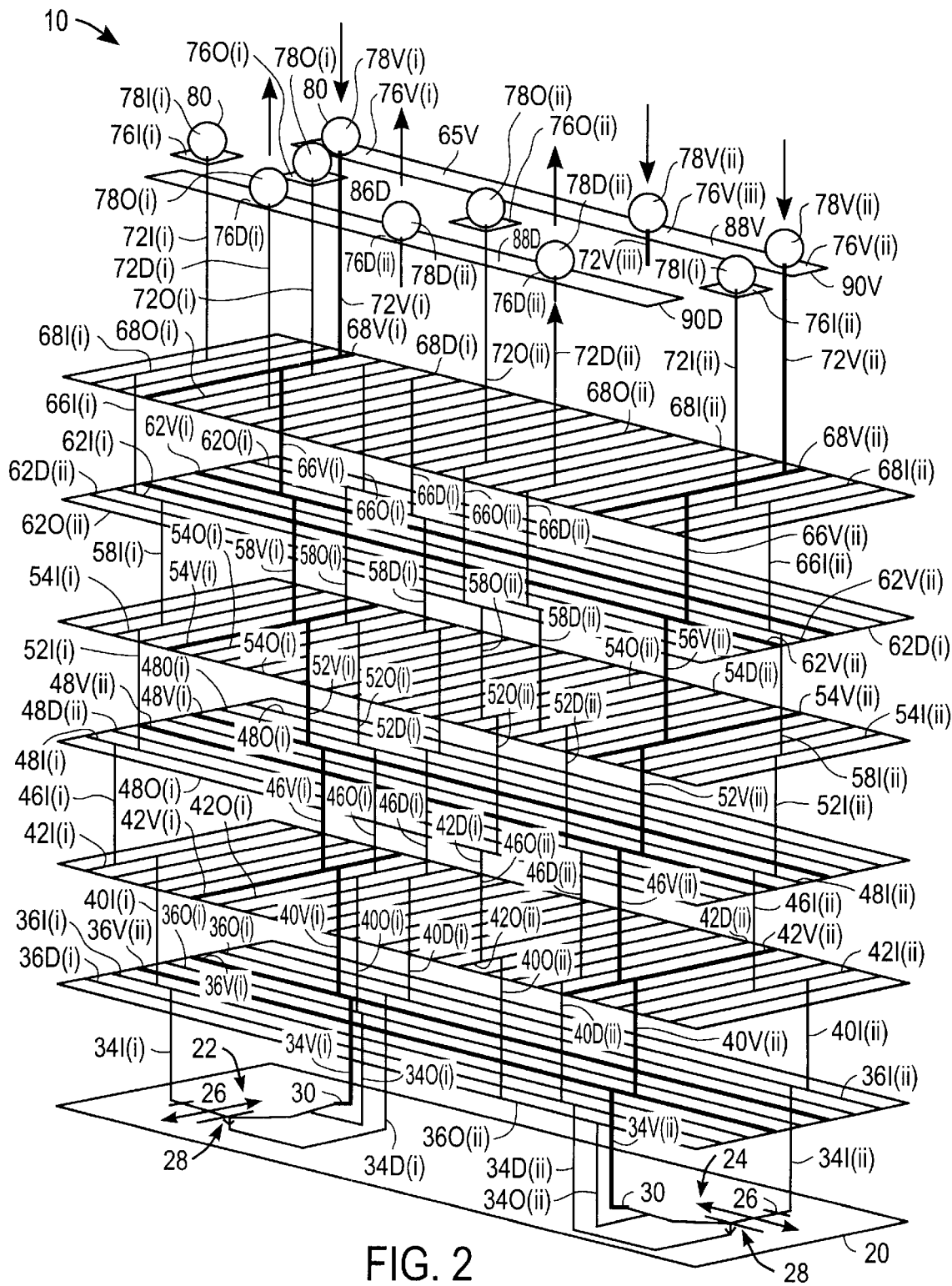

ELECTRONIC ASSEMBLY PROVIDING SHUNTING OF ELECTRICAL CURRENT

BACKGROUND OF THE INVENTION

1). Field of the Invention

This invention relates to an electronic assembly including a semiconductor package substrate, a semiconductor chip mounted to the substrate, and a socket for the substrate.

2). Discussion of Related Art

Integrated circuits are manufactured on semiconductor substrates and may include a plurality of electrical components such as transistors, diodes, resistors, and capacitors connected to one another through metal lines and vias above the electrical components to form a semiconductor chip.

Contact pads are formed on a surface of the semiconductor chip and other ones of the metal lines and vias connect selected ones of the contact pads to selected terminals of selected ones of the electrical components. These contact pads include voltage and drain contact pads and other ones of the contact pads include input signal and output signal contact pads. Solder balls or other electrical contacts are usually formed on the contact pads. A solder ball may be damaged if a current passing therethrough is very high, such as often occurs in solder balls that are used for providing electrical voltage to or providing electrical drain from the integrated circuit.

Similar problems exist in vias and pins of a semiconductor package substrate to which such a semiconductor chip is mounted. Terminal pins are often provided on a surface of the semiconductor package substrate opposing a surface to which the semiconductor chip is mounted. The terminal pins are used for complementarily mating with socket openings in a socket substrate. These terminal pins or the sockets may be damaged by power or ground currents that are very high.

BRIEF DESCRIPTION OF THE DRAWINGS

The invention is described by way of example with reference to the accompanying drawings wherein:

FIG. 1 is a cross-sectional side view of a semiconductor chip according to an embodiment of the invention;

FIG. 2 is a perspective view of conducting components of the semiconductor chip;

FIG. 3 is a cross-sectional side view of an electronic assembly according to an embodiment of the invention, including a semiconductor package substrate according to an embodiment of the invention, the semiconductor chip, and a socket substrate according to an embodiment of the invention; and FIG. 4 is a perspective view of conducting components of the semiconductor package substrate, and of the socket.

DETAILED DESCRIPTION OF THE INVENTION

FIG. 1 and FIG. 2 of the accompanying drawings illustrate a semiconductor chip 10 according to an embodiment of the invention. FIG. 3 illustrates an electronic assembly 12, according to an embodiment of the invention, including the semiconductor chip 10, a semiconductor package substrate 14, and a socket 16. FIG. 4 illustrates the semiconductor package substrate 14 and the socket 16 in more detail.

Referring to FIGS. 1 and 2, the manufacture of the semiconductor chip is now described in more detail. First, the semiconductor substrate 18 is provided and an integrated circuit 20 is formed thereon according to conventional principles. The integrated circuit 20 includes many transistors, capacitors, diodes, resistors and other electrical components. By way of example, two flip-flops 22 and 24 are shown. Each flip-flop 22 or 24 includes a diode 26, a transistor 28, and a resistor 30. The diode 26 is connected to a gate of the transistor 28 and the resistor 30 is connected to a source of the transistor 28. Connections between the electrical components 26, 28 and 30 are made according to conventional principles utilizing upper level metal lines, and is not further elaborated on herein.

A lower insulation layer 32 is formed onto the integrated circuit 20. Vias 34 are formed in the lower insulation layer 32.

A first layer of metal lines 36 is formed on the lower insulation layer 32. A first intermediary insulation layer is formed on the metal lines 36. Vias 40 are formed in the first intermediary insulation layer 38.

A second layer of metal lines 42 is formed on the first intermediary insulation layer 38. The metal lines 42 extend transversely and at right angles to the metal lines 36. A second intermediary insulation layer 44 is formed on the metal lines 42 and vias 46 are formed in the second intermediary insulation layer 44.

A third layer of metal lines 48, a third intermediary insulation layer 50, vias 52, a fourth layer of metal lines 54, a fourth intermediary insulation layer 56, and vias 58 are then formed in a manner similar to the manner in which the components 36 to 46 are formed. A fifth layer of metal lines 62, a second intermediary insulation layer 64, vias 66, metal lines 68, and an upper insulation layer 70, and vias 72 are then formed in a manner similar to the manner in which the components 48 to 58 are formed.

A controlled collapse chip connect process is then employed to form a plurality of electrical contacts 78. Each electrical contact 78 has a lower surface attached to a respective one of the contact pads 76, and an opposing surface 80 facing away from, and spaced from the respective contact pad 76.

A respective terminal of each flip-flop 22 or 24 is connected to a respective electrical contact 78 in series respectively through a respective one of the vias 34, metal lines 36, vias 40, metal lines 42, vias 46, metal lines 48, vias 52, metal lines 54, vias 58, metal lines 62, vias 66, metal lines 68, vias 72, and contact pads 76.

For example, the source of the transistor 28 of the flip-flop 22 is connected through the resistor 30 of the flip-flop 22 to a voltage via 34V(*i*). The voltage via 34V(*i*) is also connected to a voltage line 36V(*i*). A voltage via 40V(*i*) connects the voltage line 36V(*i*) to a voltage line 42V(*i*). In a similar manner, a series connection is followed from the voltage line 42V(*i*) to the voltage via 46V(*i*), a voltage line 48V(*i*), a voltage via 52V(*i*), a voltage line 54V(*i*), a voltage via 58V(*i*), a voltage line 62V(*i*), a voltage via 66V(*i*), a voltage line 68V(*i*), and a voltage via 72V(*i*). The voltage via 72V(*i*) is connected to a voltage contact pad 76V(*i*). An electrical voltage contact 78V(*i*) is attached to the voltage contact pad 76V(*i*). High-frequency current can be supplied through the electric voltage contact 78V(*i*) to the resistor 30 of the flip-flop 22.

Similarly, the source of the transistor 28 of the flip-flop 24 is connected through the resistor 30 of the flip-flop 24 to a voltage via 34V(*ii*). The voltage via 34V(*ii*) is also connected to a voltage line 36V(*ii*). A voltage via 40V(*ii*) connects the voltage line 36V(*ii*) to a voltage line 42V(*ii*). In a similar manner, a series connection is followed from the voltage line 42V(*ii*) to the voltage via 46V(*ii*), a voltage line 48V(*ii*), a voltage via 52V(*ii*), a voltage line 54V(*ii*), a voltage via 58V(*ii*), a voltage line 62V(*ii*), a voltage via 66V(*ii*), a voltage line 68V(*ii*), and a voltage via 72V(*ii*). The voltage via 72V(*ii*) is connected to a voltage contact pad 76V(*ii*). An electrical voltage contact 78V(*ii*) is attached to the voltage contact pad 76V(*ii*). High-frequency current can be supplied through the electric voltage contact 78V(*ii*) to the resistor 30 of the flip-flop 24.

A further voltage contact pad 76V(*iii*) is located between the voltage contact pads 76V(*i*) and 76V(*ii*) and is connected to a respective source of a transistor (not shown) in the integrated circuit 20. The respective electric voltage contact 78V(*iii*) is attached to the voltage contact pad 76V(*iii*).

A voltage shunt bar 90V is formed on a surface 150 of the upper insulation layer 70 and includes the voltage contact pads 76V(*i*), 76V(*ii*), and 76V(*iii*). A voltage shunt connection 86V of a voltage shunt bar 90V connects the voltage contact pad 76V(*i*) to the voltage contact pad 76V(*iii*). Another voltage shunt connection 88V of the voltage shunt bar 90V connects the voltage contact pad 76V(*iii*) to the voltage contact pad 76V(*ii*). The voltage vias 72V(*i*), 72V(*ii*), and 72V(*iii*) are thereby electrically connected to one another. Low-frequency current in one of the voltage vias 72V(*i*), 72V(*ii*), or 72V(*iii*) is split between the electric voltage contacts 78V(*i*), 78V(*ii*), and 78V(jii). For example, low-frequency current can be provided by the voltage via 72V(*ii*) through metal lines and vias connected thereto to the transistor 28 of the flip-flop 24. The voltage via 72V(*ii*) receives current from the voltage shunt bar 90V which, in turn, receives current through all of the electric voltage contacts 78V(*i*), 78V(*ii*), and 78V(*iii*).

The current flowing through a respective one of the electric voltage contacts 78V(*i*), 78V(*ii*), or 78V(*iii*) is approximately equal to the amount of current through the voltage via 72V(*ii*) divided by the number of electric voltage contacts 78V(*i*), 78V(*ii*), and 78V(*iii*). In the example illustrated, for example, there are three electric voltage contacts 78V(*i*), 78V(*ii*), and 78V(*iii*), so that a current flowing through a respective one of the electric voltage contacts 78V(*i*), 78V(*ii*), or 78V(*iii*) is approximately one third of the current flowing through the voltage via 72V(*ii*). Without the voltage shunt connections 88V or 86V, all the current flowing through the voltage via 72V(*ii*) would flow through the electric voltage contact 78V(*ii*). The voltage shunt connections 88V and 86V thus protect the electric voltage contact 78V(*ii*) from high, low-frequency currents which could burn the electric voltage contact 78V(*ii*).

Similarly, the drain of the transistor 28 of the flip-flop 22 is connected to the flip-flop 22 to a drain via 34D(*i*). The drain via 34D(*i*) is also connected to a drain line 36D(*i*). A drain via 40D(*i*) connects the drain line 36D(*i*) to a drain line 42D(*i*). In a similar manner, a series connection is followed from the drain line 42D(*i*) to the drain via 46D(*i*), a drain line 48D(*i*), a drain via 52D(*i*), a drain line 54D(*i*), a drain via 58D(*i*), a drain line, 62D(*i*), a drain via 66D(*i*), a drain line 68D(*i*), and a drain via 72D(*i*). The drain via 72D(*i*) is connected to a drain contact pad 76D(*i*). An electrical drain contact 78D(*i*) is attached to the drain contact pad 76D(*i*). High-frequency current can be conducted from the drain of the transistor 28 of the flip-flop 22 to the electric drain contact 78D(*i*).

Similarly, the drain of the transistor 28 of the flip-flop 24 is connected to the flip-flop 24 to a drain via 34D(*ii*). The drain via 34D(*ii*) is also connected to a drain line 36D(*ii*). A drain via 40D(*ii*) connects the drain line 36D(*ii*) to a drain line 42D(*ii*). In a similar manner, a series connection is followed from the drain line 42D(*ii*) to the drain via 46D(*ii*), a drain line 48D(*ii*), a drain via 52D(*ii*), a drain line 54D(*ii*), a drain via 58D(*ii*), a drain line 62D(*ii*), a drain via 66D(*ii*), a drain line 68D(*ii*), and a drain via 72D(*ii*). The drain via 72D(ii ) is connected to a drain contact pad 76D(*ii*). An electrical drain contact 78D(*ii*) is attached to the drain contact pad 76D(*ii*). High-frequency current can be conducted from the drain of the transistor 28 of the flip-flop 24 to the electric drain contact 78D(*ii*).

A further drain contact pad 76D(*iii*) is located between the drain contact pads 76V(*i*) and 76V(*ii*) and is connected to a respective source of a transistor (not shown) in the integrated circuit 20. The respective electric drain contact 78D (*iii*) is attached to the drain contact pad 76D(*iii*).

A drain shunt bar 90D is formed on the surface of the upper insulation layer 70 and includes the drain contact pads 76D(*i*), 76D(*ii*), and 76D(*iii*). A drain shunt connection 86D of the drain shunt bar 90D connects the drain contact pad 76D(*i*) to the drain contact pad 76D(*iii*). Another drain shunt connection 88D of the drain shunt bar 90D connects the drain contact pads 76D(*iii*) to the drain contact pad 76D(*ii*). The drain vias 72D(*i*), 72D(*ii*), and 72D(*iii*) are thereby electrically connected to one another. Low-frequency current in one of the drain vias 72D(*i*), 72D(*ii*), or 72D(*iii*) is split between the electric drain contact 78D(*i*), 78D(*ii*), and 78D(*iii*). For example, low-frequency current can flow from the transistor 30 of the flip-flop 24 through metal lines and vias connected thereto to the drain via 72D(*ii*). The drain via 72D(*ii*) provides current to the drain shunt bar 90D which, in turn, provides current through all of the electric drain contacts 78D(*i*), 78D(*ii*), and 78D(*iii*).

The current flowing through a respective one of the electric drain contacts 78D(*i*), 78D(*ii*), or 78D(*iii*) is approximately equal to the amount of current through the drain via 72D(*ii*) divided by the number of electric drain contacts 78D(*i*), 78D(*ii*), and 78D(*iii*). In the example illustrated, for example, there are three electric drain contacts 78D(*i*), 78D(*ii*), and 78D(*iii*), so that a current flowing through a respective one of the electric drain contacts 78D(*i*), 78D(*ii*), or 78D(*iii*) is approximately one third of the current flowing through the drain via 72D(*ii*). Without the drain shunt connections 88D or 86D, all the current flowing through the drain via 72D(*ii*) would flow through the electric drain contact 78D(*ii*). The drain shunt connections 88D and 86D thus protect the electric drain contact 78D(*ii*) from high, low-frequency currents which could burn the electric drain contact 78D(*ii*).

A terminal of the diode 26 of the flip-flop 22 is connected to an input signal via 34I(*i*). The input signal via 34I(*i*) is also connected to an input signal line 36I(*i*). An input signal via 40I(*i*) connects the input signal line 36I(*i*) to an input signal line 42I(*i*). In a similar manner, a series connection is followed from the input signal line 42I(*i*) to the input signal via 46I(*i*), an input signal line 48I(*i*), an input signal via 52I(*i*), an input signal line 54I(*i*), an input signal via 58I(*i*), an input signal line 62I(*i*), an input signal via 66I(*i*), an input signal line 68I(*i*), and an input signal via 72I(*i*). The input signal via 72I(*i*) is connected to an input signal contact pad 76I(*i*). An electrical input signal contact 78I(*i*) is attached to the input signal contact pad 76I(*i*). An input signal can be provided from the electrical input signal contact 78I(*i*) to the terminal of the diode 26 of the flip-flop 22.

Similarly, a terminal of the diode 26 of the flip-flop 24 is connected to an input signal via 34I(*ii*). The input signal via 34I(*ii*) is also connected to an input signal line 36I(*ii*). An input signal via 40I(*ii*) connects the input signal line 36I(*ii*) to an input signal line 42I(*ii*). In a similar manner, a series connection is followed from the input signal line 42I(*ii*) to the input signal via 46I(*ii*), an input signal line 48I(*ii*), an input signal via 52I(*ii*), an input signal line 54I(*ii*), an input signal via 58I(*ii*), an input signal line 62I(*ii*), an input signal via 66I(*ii*), an input signal line 68I(*ii*), and an input signal via 72I(*ii*). The input signal via 72I(*ii*) is connected to an input signal contact pad 76I(*ii*). An electrical input signal contact 78I(*ii*) is attached to the input signal contact pad 76I(*ii*). An input signal can be provided from the electrical drain contact 78I(*ii*) to the terminal of the diode 26 of the flip-flop 24.

A source of the transistor 28 of the flip-flop 22 is connected to an output signal via 34O(*i*). The output signal via 34O(*i*) is also connected to an output signal line 36O(*i*). An output signal via 40O(*i*) connects the output signal line 36O(*i*) to an output signal line 42O(*i*). In a similar manner, a series connection is followed from the output signal line 42O(*i*) to the output signal via 46O(*i*), an output signal line 48O(*i*), an output signal via 52O(*i*), an output signal line 54O(*i*), an output signal via 58O(*i*), an output signal line 62O(*i*), an output signal via 66O(*i*), an output signal line 68O(*i*), and an output signal via 72O(*i*). The output signal via 72O(*i*) is connected to an output signal contact pad 76O(*i*). An electrical output signal contact 78O(*i*) is attached to the output signal contact pad 76O(*i*). An output signal can be provided from the source of the transistor 28 of the flip-flop 22 to the electric output signal contact 78O(*i*).

Similarly, a source of the transistor 28 of the flip-flop 24 is connected to an output signal via 34O(*ii*). The output signal via 34O(*ii*) is also connected to an output signal line 36O(*ii*). An output signal via 40O(*ii*) connects the output signal line 36O(*ii*) to an output signal line 42O(*ii*). In a similar manner, a series connection is followed from the output signal line 42O(*ii*) to the output signal via 46O(*ii*), an output signal line 48O(*ii*), an output signal via 52O(*ii*), an output signal line 54O(*ii*), an output signal via 58O(*ii*), an output signal line 62O(*ii*), an output signal via 66O(*ii*), an output signal line 68O(*ii*), and an output signal via 72O(*ii*). The output signal via 72O(*ii*) is connected to an output signal contact pad 76O(*ii*). An electrical output signal contact 78O(*ii*) is attached to the output signal contact pad 76O(*ii*). An output signal can be provided from the source of the transistor 28 of the flip-flop 24 to the electric output signal contact 78O(*ii*).

High-frequency currents still follow the path of least inductance (as opposed to low-frequency current that follows the path of least resistance). High-frequency current therefore tends not to be split up by the voltage shunt bar 90V or the drain shunt bar 90D.

The manufacture of the semiconductor package substrate 14 is now described with reference to FIGS. 3 and 4. A lower insulating layer 110 is provided on which is formed a first power plane 112, followed sequentially by a first intermediate insulating layer 114, a first layer of metal lines 116, a second intermediary insulating layer 118, a first ground plane 120, a third intermediary insulating layer 122, a second layer of metal lines 124, a fourth intermediary insulating layer 126, a second power plane 128, a fifth intermediary insulating layer 130, a third layer of metal lines 132, a sixth intermediary insulating layer 134, a second ground plane 136, and an upper insulating layer 138. High-frequency terminal pins 144 are attached to a lower surface 146 of the lower insulating layer 110. Contact terminals 148 are formed on an upper surface 150 of the upper insulating layer 138.

A first power via 152P(*i*) connects the first power plane 112 to a first power contact terminal 148P(*i*). A first high-frequency power via 154P(*i*) connects a high-frequency power terminal pin 144P(*i*) to the first power plane 112. High-frequency current can be provided through the high-frequency power terminal pin 144P(*i*) through the first high-frequency power via 154P(*i*), the first power plane 112, the first power via 152P(*i*), to the first power contact terminal 148P(*i*).

A second power via 152P(*ii*) connects the second power plane 128 to a second power contact terminal pin 148P(*ii*). A second high-frequency power via 154P(*ii*) connects a high-frequency power terminal 144P(*ii*) to the second power plane 128. High-frequency current can be provided through the high-frequency power terminal pin 144P(*ii*) through the second high-frequency power via 154P(*ii*), the second power plane 128, the second power via 152P(*ii*), to the second power contact terminal 148P(*ii*).

A first ground via 152G(*i*) connects the first ground plane 120 to a first ground contact terminal 148G(*i*). A first high-frequency ground via 154G(*i*) connects a high-frequency ground terminal pin 144G(*i*) to the first ground plane 120. High-frequency ground current can flow from the first ground terminal pin 144G(*i*) to the first ground via 152G(*i*), and then to the first ground plane 120, and from there through the first high-frequency ground via 154G(*i*) to the first high-frequency ground terminal 144G(*i*).

A second ground via 152G(*ii*) connects the second ground plane 136 to a second ground contact terminal 148G(*ii*). A second high-frequency ground via 154G(*ii*) connects a high-frequency ground terminal pin 144G(*ii*) to the second ground plane 136. High-frequency ground current can flow from the second ground terminal pin 144 G(*ii*) to the second ground via 152G(*ii*), and then to the second ground plane 136, and from there through the second high-frequency ground via 154G(*ii*) to the second high-frequency ground terminal 144G(*ii*).

All the vias 152 and 154 are located in and extend partially through the insulating layers of semiconductor package substrate 14. The vias 152 and 154 are only connected at their ends to conducting components. The first power via 152P(*i*), for example, is not connected to the first or second ground planes 112 or 128 or to the second power plane 136.

The semiconductor package substrate 14 is further formed with a power shunt bar 160P and a ground shunt bar 160G. The power shunt bar 160P has a lower end protruding from the lower surface 146 of the lower insulating layer 110 to form a power shunt terminal 162P. An upper end of the power shunt bar 160P is connected to the second power plane 128. The first power plane 112 is connected to the power shunt bar 160P at a location between the power shunt terminal 162P and the upper end of the power shunt bar 160P.

Low-frequency power current can be provided through the power shunt terminal 162P to the power shunt bar 160P. The low-frequency power current can then flow through either the first power plane 112 or the second power plane 128, to either the first power contact terminal 148P(*i*) or the second power contact terminal 148P(*ii*), or to both of them. It can thus be seen that power is supplied to the power contact terminals 148P(*i*) and 148P(*ii*) without having to pass current through the high-frequency power terminal pins 144P(*i*) or 144P(*ii*). The high-frequency power terminal pins 144P(*i*) and 144P(*ii*) and the high-frequency power vias 154P(*i*) and 154P(*ii*) are thus protected from high, low-frequency currents. High-frequency current can still flow through the high-frequency power terminals 144P(*i*) and 144P(*ii*) and the high-frequency power vias 154P(*i*) and 154P(*ii*).

The ground shunt bar 160P has a lower end protruding from the lower surface 146 of the lower insulating layer 110 to form a ground shunt terminal 162P. An upper end of the ground shunt bar 160P is connected to the second ground plane 136. The first ground plane 120 is connected to the ground shunt bar 160P at a location between the ground shunt terminal 162P and the upper end of the ground shunt bar 160P.

Low-frequency ground current can flow from either the first ground terminal 148G(i) or the first ground terminal 148G(ii), or both, to either the first ground plane 120 or the second ground plane 136. The ground current then flows from either the first ground plane 120 or the second ground plane 136, or both, to the ground shunt bar 160G, through which the current then flows to the ground shunt terminal 162G. As such, the high-frequency ground terminal pins 144G(i) and 144G(ii) are protected from high, low-frequency ground current, as are the first and second high-frequency ground vias 154G(i) and 154G(ii).

The semiconductor package also includes interconnection for input and output signals. A respective series connection connects a respective output contact terminal 148O to a respective output terminal pin 144O. The series connection includes a metal line 132, 124, and 116 and output vias 170 connected in series. A similar series connection connects a respective input terminal pin (not shown) of the pins 144 to a respective input contact terminal (not shown) of the terminals 144.

Figure 3:
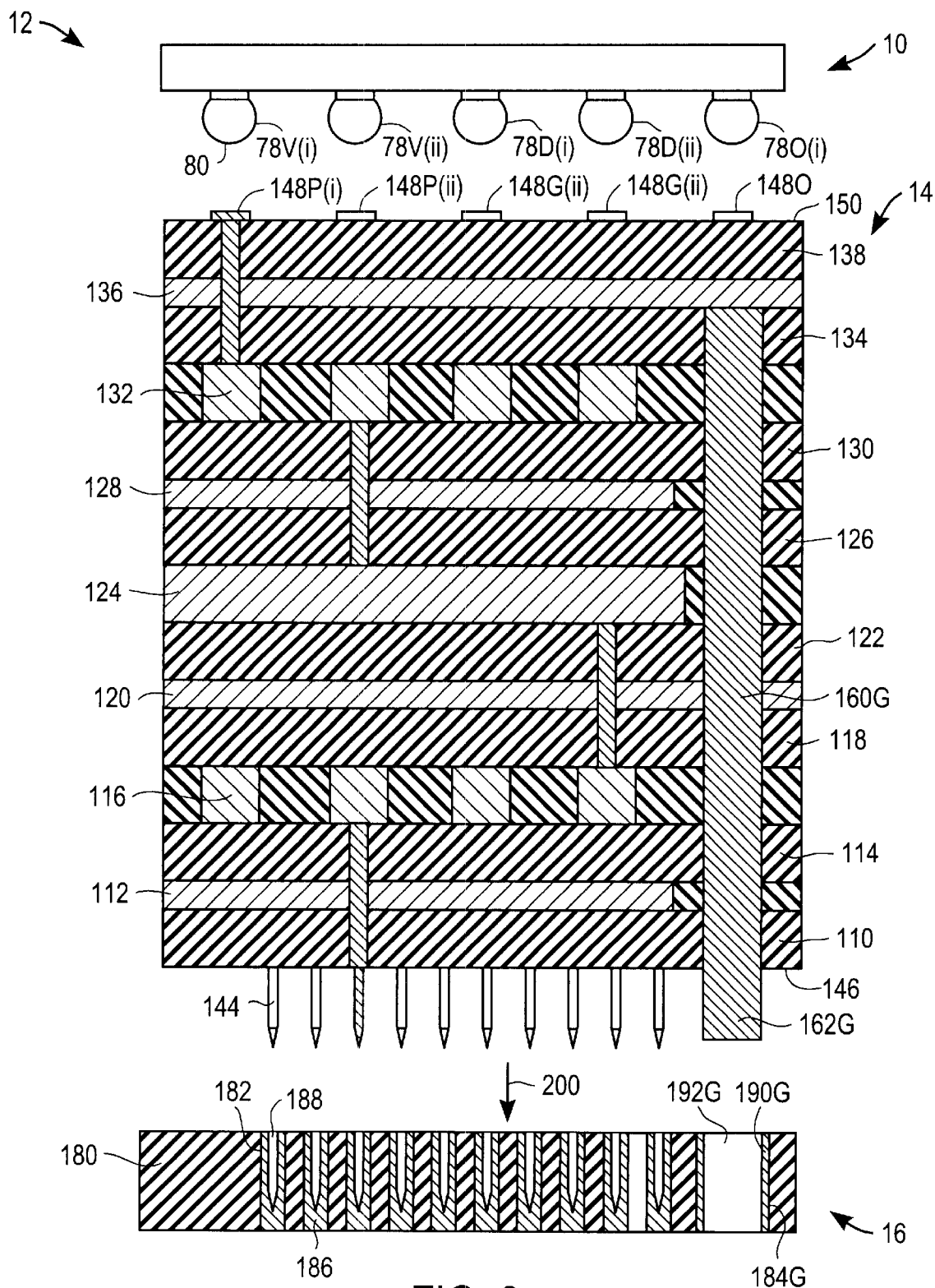
Figure 4:
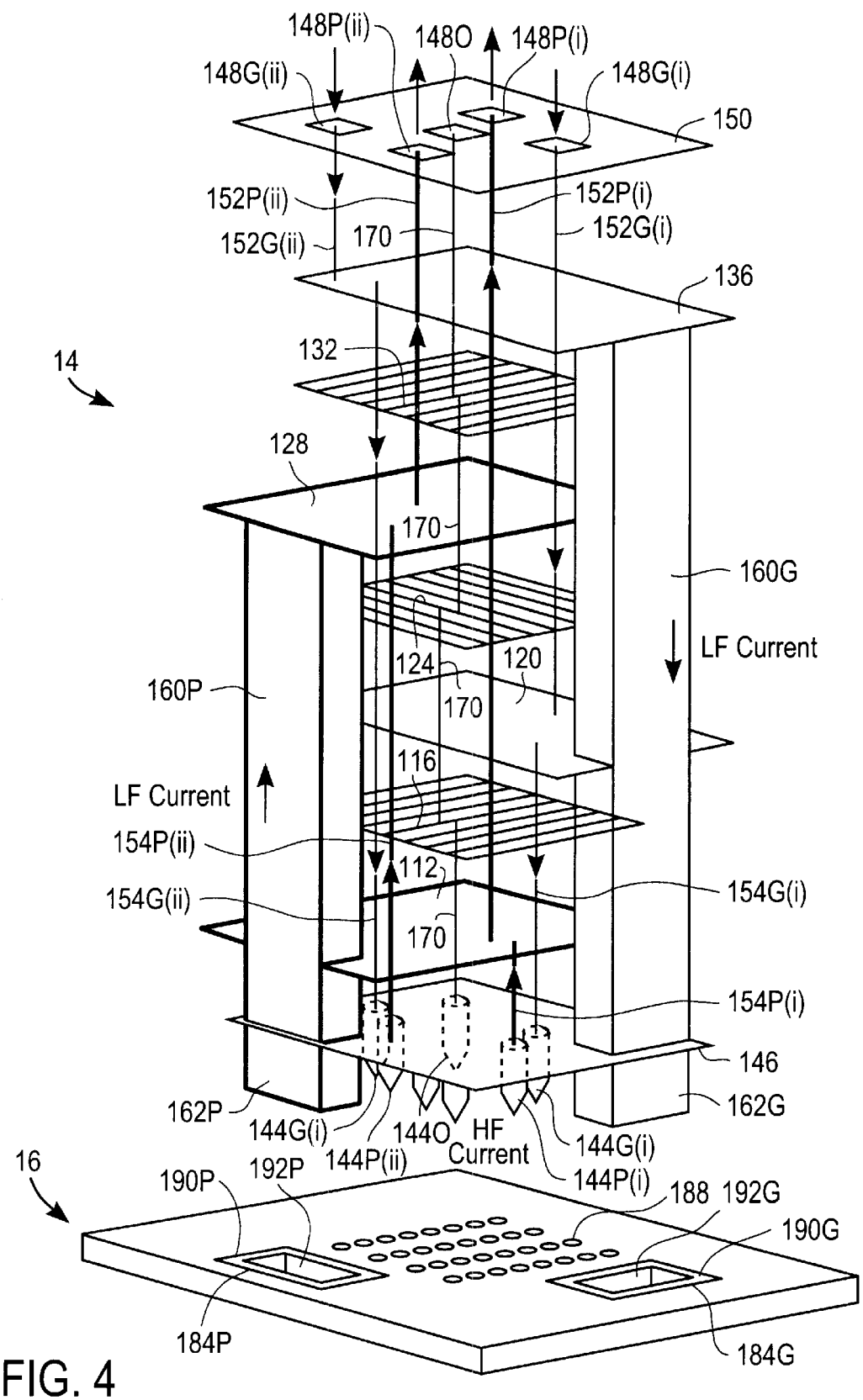

FIG. 3 illustrates how the semiconductor chip 10 is attached to the semiconductor package substrate 14. The surface 80 of a respective one of the electrical signal contacts 78 is located against a respective one of the contact terminals 148. The electric voltage contact 78V(i) is located against the power contact terminal 148P(i). The electric voltage contact 78V(ii) is located against the power contact terminal 148P(ii). The electric drain contact 78D(i) is located against the ground contact terminal 148G(i). The electric drain contact 78D(ii) is located against the ground contact terminal 148G(ii). The electric output signal contact 78O(i) is located against the output signal terminal 148O and a similar connection is made between the electric input signal contact 78I(i) and the input signal terminal (not shown). The semiconductor chip 10 and the package substrate 14 are then together located in an oven which heats the electric contacts 78, reflowing them over the contact terminals 148, whereafter the semiconductor chip 10 and the package substrate 14 are cooled, thereby attaching the electric contacts 78 to the contact terminals 148.

The socket 16 includes a socket substrate 180 having a plurality of high-frequency openings 182, a power shunt opening 184P, and a ground shunt opening 184G formed therein. A respective high-frequency contact 186 is formed within a respective one of the high-frequency openings 182. Each high-frequency contact 186 has a respective high-frequency socket 188 therein. The high-frequency socket corresponds with a shape of a respective one of the high-frequency terminal pins 144. An electrical power shunt contact 190P and an electrical ground shunt contact 190G are formed within the power shunt opening 184P and the ground shunt opening 184G, respectively. The electrical power shunt contact 190P forms a power shunt socket 192P and the electrical ground shunt contact forms a ground shunt socket 192G. The power shunt socket 192P corresponds in shape to a shape of the power shunt terminal 162P and the ground shunt socket 192G corresponds in shape to the ground shunt terminal 162G.

The semiconductor package substrate 14, with the semiconductor chip 10 mounted thereto, is moved in a direction 200 towards the socket substrate 180. Movement in a direction 200 causes simultaneous mating of a respective one of the high-frequency terminal pins 144 with a respective one of the high-frequency sockets 188, mating of the power 162P with the power shunt socket 192P, and mating of the ground shunt terminal 162G with the ground shunt socket 192G. The socket 16 can be mounted to a motherboard and each of the high-frequency contacts 186, the electrical power shunt contact 190P, and the ground shunt contact 190G can be electrically connected to the motherboard. Movement in the direction 200 will thus electrically connect the semiconductor package substrate 14 and the semiconductor chip 10 to the motherboards.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A semiconductor chip comprising:
   a semiconductor substrate;
   an integrated circuit of electrical components on the semiconductor substrate;
   a first insulation layer on the integrated circuit;
   a plurality of voltage lines over the first insulation layer;
   a plurality of voltage vias in the first insulation layer, each connecting a respective electrical component to a respective voltage line;
   a final insulation layer over the voltage lines, from the substrate to the final insulation layer forming part of a composite stack of layers formed directly on one another;
   a plurality of voltage contact pads on the final insulation layer;
   a plurality of voltage vias in the final insulation layer, each electrically connecting a respective voltage line to a respective voltage contact pad, a plurality of series connections being formed, each from and including a respective voltage via in the first insulation layer up to and including a respective one of the voltage contact pads; and
   a voltage shunt connection located above the first insulation layer and having portions contacting the series connections so as to electrically connect the voltage lines to one another.

2. The semiconductor chip of claim 1, further comprising:
   a plurality of electric voltage contacts, each attached to a respective voltage contact pad and having a surface that is spaced from and opposing the voltage contact pad.

3. The semiconductor chip of claim 1, wherein the voltage contact pads and the voltage shunt connection form a voltage shunt bar on the final insulation layer.

4. The semiconductor chip of claim 3, further comprising:
   a plurality of electric voltage contacts, each attached to a respective voltage contact pad and having a surface that is spaced from and opposing the voltage contact pad.

5. The semiconductor chip of claim 4, comprising at least three voltage contact pads, at least three electric voltage contacts, each attached to a respective voltage contact pad, and at least two voltage shunt connections, a first connecting a first of the voltage contact pads to a second of the voltage contact pads, and the second connecting the second voltage contact pad to a third of the voltage contact pads.

6. The semiconductor chip of claim 1, wherein the voltage lines are located in a first plane substantially parallel to the semiconductor substrate.

7. The semiconductor chip of claim 6, further comprising:
an intermediary insulation layer over the voltage lines in the first plane;
a plurality of voltage lines in a second plane over the intermediary insulation layer; and
a plurality of voltage vias in the intermediary insulation layer, each electrically connecting a respective voltage line in the first plane with a respective voltage line in the second plane, the final insulation layer being formed over the voltage lines in the second plane.

8. The semiconductor chip of claim 1, wherein the electrical components include a plurality of transistors, each voltage via being connected to a respective source of a respective transistor.

9. The semiconductor chip of claim 1, further comprising:
a plurality of drain lines over the first insulation layer;
a plurality of drain vias in the first insulation layer, each connecting a respective electrical component to a respective drain line;
a plurality of drain contact pads on the final insulation layer;
a plurality of drain vias in the final insulation layer, each connecting a respective drain line to a respective drain contact pad; and
a drain shunt connection electrically connecting the drain lines to one another.

10. The semiconductor of claim 9, further comprising:
a plurality of electric drain contacts, each attached to a respective drain contact pad and having a surface that is spaced from and opposing the drain contact pad.

11. The semiconductor chip of claim 9, wherein the drain contact pads and the drain shunt connection form a drain shunt bar on the final insulation layer.

12. The semiconductor chip of claim 11, further comprising:
a plurality of electric drain contacts, each attached to a respective drain contact pad and having a surface that is spaced from and opposing the drain contact pad.

13. The semiconductor chip of claim 12, comprising at least three drain contact pads, at least three electric drain contacts, each attached to a respective drain contact pad, and at least two drain shunt connections, a first connecting a first of the drain contact pads to a second of the drain contact pads, and the second connecting the second drain contact pad to a third of the drain contact pads.

14. The semiconductor chip of claim 9, wherein the drain lines are located in a first plane substantially parallel to the semiconductor substrate.

15. The semiconductor chip of claim 14, wherein the voltage lines are located in the first plane.

16. The semiconductor chip of claim 14, further comprising:
an intermediary insulation layer over the drain lines in the first plane;
a plurality of drain lines in a second plane over the intermediary insulation layer; and
a plurality of drain vias in the intermediary insulation layer, each connecting a respective drain line in the first plane with a respective drain line in the second plane, the final insulation layer being formed over the drain lines in the second plane.

17. The semiconductor chip of claim 9, wherein the electrical components include a plurality of transistors, each drain via being connected to a respective drain of a respective transistor.

18. The semiconductor chip of claim 9, further comprising:
a plurality of signal lines over the first insulation layer;
a plurality of signal vias in the first insulation layer, each connecting a respective electrical component to a respective signal line;
a plurality of signal contact pads on the final insulation layer; and
a plurality of signal vias in the final insulation layer, each connecting a respective signal line to a respective signal contact pad.

19. The semiconductor chip of claim 18, wherein the electrical components include a plurality of transistors, each voltage via being connected to a respective source of a respective transistor, each drain via being connected to a respective drain of a respective transistor, and each signal via being connected to a respective gate of a respective transistor.

20. A semiconductor chip comprising:
a semiconductor substrate;
an integrated circuit of electrical components on the semiconductor substrate;
a first insulation layer on the integrated circuit;
a plurality of voltage lines over the first insulation layer;
a plurality of drain lines over the first insulation layer;
a plurality of voltage vias in the first insulation layer, each connecting a respective electrical component to a respective voltage line;
a plurality of drain vias in the first insulation layer, each connecting a respective electrical component to a respective drain line;
a final insulation layer over the voltage lines and the drain lines;
a plurality of voltage contact pads on the final insulation layer;
a plurality of drain contact pads on the final insulation layer;
a plurality of voltage vias in the final insulation layer, each electrically connecting a respective voltage line to a respective voltage contact pad;
a plurality of drain vias in the final insulation layer, each electrically connecting a respective drain line to a respective drain contact pad;
a voltage shunt connection electrically connecting the voltage lines to one another;
a drain shunt connection electrically connecting the drain lines to one another;
a plurality of signal vias in the final insulation layer, each connecting a respective signal line to a respective signal contact pad;
a voltage shunt connection electrically connecting the voltage lines to one another; and
a drain shunt connection electrically connecting the drain lines to one another.

21. The semiconductor chip of claim 20, wherein the voltage contact pads and the voltage shunt connection form a voltage shunt bar on the final insulation layer, and the drain contact pads and the drain shunt connection form a drain shunt bar on the final insulation layer.

22. The semiconductor chip of claim 21, further comprising:
a plurality of electric voltage contacts, each attached to a respective voltage contact pad and having a surface that is spaced from and opposing the voltage contact pad, and a plurality of electric drain contacts, each attached to a respective drain contact pad and having a surface that is spaced from and opposing the drain contact pad.

23. A semiconductor chip comprising:

a semiconductor substrate;

an integrated circuit of electrical components on the semiconductor substrate;

a first insulation layer on the integrated circuit;

a plurality of voltage lines over the first insulation layer;

a plurality of drain lines over the first insulation layer;

a plurality of signal lines over the first insulation layer;

a plurality of voltage vias in the first insulation layer, each connecting a respective electrical component to a respective voltage line;

a plurality of drain vias in the first insulation layer, each connecting a respective electrical component to a respective drain line;

a plurality of signal vias in the first insulation layer, each connecting a respective electrical component to a respective signal line;

a final insulation layer over the voltage lines and the drain lines;

a plurality of voltage contact pads on the final insulation layer;

a plurality of drain contact pads on the final insulation layer;

a plurality of signal contact pads on the final insulation layer;

a plurality of voltage vias in the final insulation layer, each electrically connecting a respective voltage line to a respective voltage contact pad;

a plurality of drain vias in the final insulation layer, each electrically connecting a respective drain line to a respective drain contact pad;

a voltage shunt connection electrically connecting the voltage lines to one another; and a drain shunt connection electrically connecting the drain lines to one another.

24. The semiconductor chip of claim 23, wherein the electrical components include a plurality of transistors, each voltage via being connected to a respective source of a respective transistor, each drain via being connected to a respective drain of a respective transistor, and each signal via being connected to a respective gate of a respective transistor.

25. A semiconductor chip comprising:

a semiconductor substrate;

an integrated circuit of electrical components on the semiconductor substrate;

a first insulation layer on the integrated circuit;

a plurality of voltage lines over the first insulation layer;

a plurality of drain lines over the first insulation layer;

a plurality of voltage vias in the first insulation layer, each connecting a respective electrical component to a respective voltage line;

a plurality of drain vias in the first insulation layer, each connecting a respective electrical component to a respective drain line;

a final insulation layer over the voltage and drain lines;

a plurality of voltage contact pads on the final insulation layer;

a plurality of voltage vias in the final insulation layer, each electrically connecting a respective voltage line to a respective voltage contact pad;

a plurality of drain contact pads on the final insulation layer;

a plurality of drain vias in the final insulation layer, each connecting a respective drain line to a respective drain contact pad;

a voltage shunt connection electrically connecting the voltage lines to one another; and a drain shunt connection electrically connecting the drain lines to one another.

* * * * *